United States Patent
Yamashita et al.

(10) Patent No.: US 7,921,551 B2
(45) Date of Patent: Apr. 12, 2011

(54) ELECTRONIC COMPONENT MOUNTING METHOD

(75) Inventors: Yoshihisa Yamashita, Kyoto (JP); Seiji Karashima, Osaka (JP); Takashi Kitae, Osaka (JP); Seiichi Nakatani, Osaka (JP); Toshiyuki Kojima, Kyoto (JP); Shingo Komatsu, Osaka (JP)

(73) Assignee: Panasonic Corporation, Osaka (JP)

( * ) Notice: Subject to any disclaimer, the term of this patent is extended or adjusted under 35 U.S.C. 154(b) by 746 days.

(21) Appl. No.: 11/886,747

(22) PCT Filed: Mar. 23, 2006

(86) PCT No.: PCT/JP2006/305796
§ 371 (c)(1),
(2), (4) Date: Sep. 20, 2007

(87) PCT Pub. No.: WO2006/101155
PCT Pub. Date: Sep. 28, 2006

(65) Prior Publication Data
US 2009/0223705 A1  Sep. 10, 2009

(30) Foreign Application Priority Data
Mar. 24, 2005  (JP) ................................ 2005-085472

(51) Int. Cl.
*H05K 3/30* (2006.01)
(52) U.S. Cl. .............. 29/832; 29/830; 29/840; 438/108
(58) Field of Classification Search ............... 29/830, 29/832, 840; 438/108
See application file for complete search history.

(56) References Cited

U.S. PATENT DOCUMENTS

| 6,172,878 B1 | 1/2001 | Takabayashi et al. |
| 2002/0159243 A1* | 10/2002 | Ogawa et al. .................. 361/760 |
| 2007/0001313 A1* | 1/2007 | Fujimoto et al. .............. 257/778 |
| 2008/0017995 A1* | 1/2008 | Karashima et al. ........... 257/778 |
| 2009/0266592 A1* | 10/2009 | Koyama et al. ............... 174/259 |

FOREIGN PATENT DOCUMENTS

| JP | 1-157796 | 6/1989 |
| JP | 11-195860 | 7/1999 |
| JP | 2001-308222 | 11/2001 |
| JP | 2003-60339 | 2/2003 |
| JP | 2004-260131 | 9/2004 |
| WO | 2004/070827 A * | 8/2004 |

* cited by examiner

*Primary Examiner* — C. J Arbes
(74) *Attorney, Agent, or Firm* — McDermott Will & Emery LLP (57) ABSTRACT

An electronic component mounting method includes a step of applying a resin composition (3) including solder powder, convective additive and resin having fluidity at the melting temperature of the solder powder on a main surface of a wiring substrate (1) provided with conductive wirings and connecting terminals, a step of preparing a group of electronic components consisting of a plurality of electronic components (7, 8 and 9) including at least a passive component, the respective electronic components comprising electrode terminals, position-aligning connecting terminals with the electrode terminals, and making the group of electronic components abut a surface of the resin composition, a step of heating at least the resin composition so as to melt solder powder and make the solder powder self-assembled between the connecting terminals and the electrode terminals by the convective additive, and thereby connecting the connecting terminals and the electrode terminals by soldering, and a step of fixedly adhering the group of electronic components to the wiring substrate using the resin by hardening the resin in the resin composition. Accordingly, a mounting process can be remarkably simplified without forming bumps in advance.

13 Claims, 6 Drawing Sheets

ELECTRONIC COMPONENT MOUNTING METHOD

RELATED APPLICATIONS

This application is the U.S. National Phase under 35 U.S.C. §371 of International Application No. PCT/JP2006/305796, filed on Mar. 23, 2006, which in turn claims the benefit of Japanese Application No. 2005-085472, filed on Mar. 24, 2005, the disclosures of which Applications are incorporated by reference herein.

FIELD OF THE INVENTION

The present invention relates to an electronic component mounting method for mounting electronic components such as a semiconductor element and a chip resistor in one lot on a wiring substrate by means of soldering and an electronic circuit device produced according to the method.

BACKGROUND OF THE INVENTION

In the case of producing an electronic circuit device by mounting electronic components such as a semiconductor element and a chip resistor on a wiring substrate, the components are generally connected by means of soldering.

For example, when passive components such as a chip resistor and a chip capacitor are secured, a predetermined amount of soldering paste is printed on connecting terminals of the wiring substrate by means of screen printing, and an adhesive strength of the soldering paste is utilized to secure the passive components. After the plurality of passive components are secured, they are placed in a reflow furnace and solder-connected in one lot.

However, the foregoing connecting method has the following problems: as the passive components such as the chip resistor and the chip capacitor are increasingly reduced in size, the solder is likely to be short-circuited between the adjacent connecting terminals when the components are solder-connected; and it becomes more difficult to apply the soldering paste by means of the screen printing and accurately mount the passive components at predetermined positions on the wiring substrate using a component supplier.

As a method of producing the electronic circuit device, not only the passive components but also the semiconductor element are mounted in one lot on the wiring substrate. In the case of a semiconductor element comprising lead pins such as QFP and a chip component such as a chip resistor, for example, the soldering paste is applied in advance to the connecting terminals of the wiring substrate in a manner similar to the foregoing case, and the adhesive strength of the soldering paste is utilized to secure the semiconductor element and the chip component. After that, they are placed in the reflow furnace to be solder-connected in one lot.

In the case of a semiconductor element having the BGA structure, solder balls are provided, and the semiconductor element and the wiring substrate are connected to each other by the solder balls. Further, a semiconductor element having the bare-chip structure is directly mounted on the wiring substrate in some cases. In the direct mounting method, bumps whose material is solder, gold (Au) or the like are formed on surfaces of electrode terminals of the semiconductor element so as to realize the connection via the bumps. The flip-chip mounting method in which such bumps are used is widely employed because the connection can be realized with fine pitches and a highly functional electronic circuit device of smaller size can be realized.

Figure 8A:
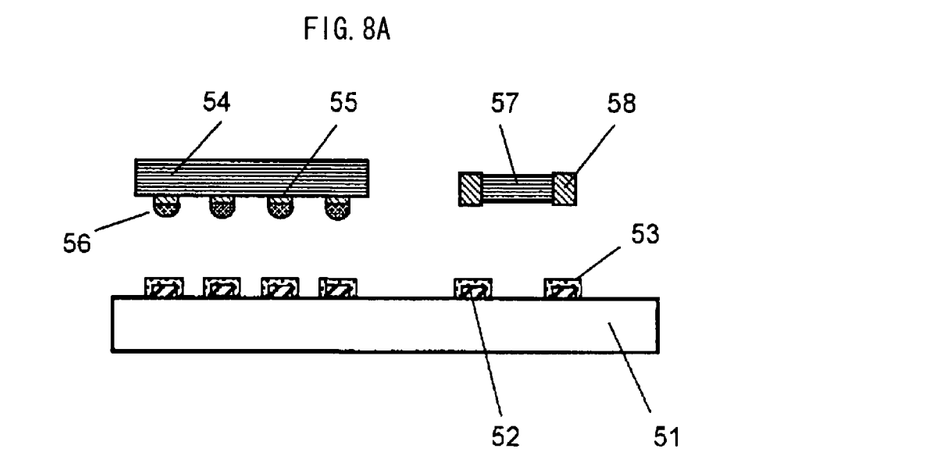
FIG. 8A is a sectional view of a first process for describing an example of an electronic circuit device producing method according to a conventional technology.
Figure 8B:
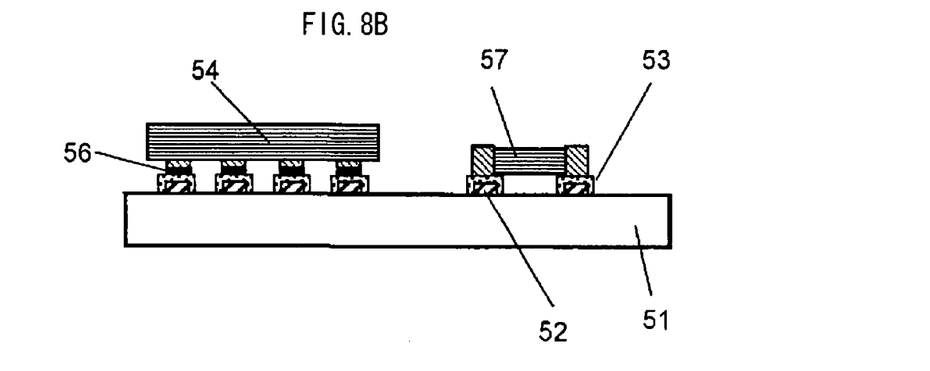
FIG. 8B is a sectional view of a second process for describing an example of the electronic circuit device producing method according to the conventional technology.

FIGS. 8A-8B are sectional views of a process for describing an example of a conventional electronic circuit device producing method. As shown in FIG. 8A, first, solder paste layers 53 are formed on surfaces of connecting terminals 52 of a wiring substrate 51 provided with conductive wirings (not shown) by means of the screen printing method or the like, and solder bumps 56 are formed on electrode terminals 55 of a semiconductor element 54. Next, positions of the connecting terminals 52 of the wiring substrate 51 and the electrode terminals 55 of the semiconductor element 54 are aligned, and further, positions of a chip component 57 and the connecting terminals 52 of the wiring substrate 51 are aligned. Then, the wiring substrate 51 and the semiconductor substrate 52 are temporarily secured to each other, and the wiring substrate 51 and the semiconductor substrate 52 are heated just the way they are in the reflow furnace so that the solder is melted. Accordingly, the electrode terminals 55 and 58 are electrically connected to the connecting terminals 52 of the wiring substrate 51. The connection state thus obtained is shown in FIG. 8B.

A packaged semiconductor element can be handled in the same manner as the chip component is handled and subjected to the reflow process in the same process. However, a bare-chip semiconductor element often demands the connection with fine pitches, which makes it difficult for the semiconductor element to be subjected to the reflow in the same process as that for the chip component for soldering connection.

In order to cope with the difficulty, there was proposed a conventional method wherein the chip components such as the chip resistor and the chip capacitor are mounted in a first reflow process, and subsequently the electrode terminals of the semiconductor element provided with the bumps are mounted on the connecting terminals of the wiring substrate using supersonic waves (for example, see the Patent Document 1).

In order to realize the flip-chip mounting method, it is necessary to form the bumps on the surfaces of the electrode terminals of the semiconductor element. However, the formation of the bumps becomes more costly as the number of the terminals increases.

Examples of the conventional technology for the formation of the bumps include the plating method, screen printing method and the like. The plating method is capable of forming the bumps with fine pitches, however, the process thereof is complicated. Further, the method is disadvantageous in its productivity and waste disposal. The screen printing method is superior in its productivity; however, requires the use of a printing mask, which makes it difficult for the bumps to be formed with fine pitches.

For example, the following method is available as a method wherein the bumps can be formed with fine pitches by means of the solder. A paste-like composition (solder deposited through chemical reactions) whose main constituents are organic acid lead salt and metallic tin is spread entirely on the wiring substrate provided with the connecting terminals, and the wiring substrate is heated, so that the substitute reaction is generated between lead (Pb) and tin (Sn), and then, alloy of Pb/Sn is selectively deposited on the connecting terminals of the wiring substrate (for example, see the Patent Document 2).

Patent Document 1: 2003-60339 of the Japanese Patent Publication Laid-Open

Patent Document 2: H01-157796 of the Japanese Patent Publication Laid-Open

DISCLOSURE OF THE INVENTION

Problems to be Solved by the Invention

As described above, in the semiconductor element flip-chip mounting methods conventionally adopted, whether it is the method of reflow-soldering the semiconductor element and the other electronic components such as the chip component in one lot or the method of connecting only the semiconductor element in a different process using ultrasonic waves as described above, it is necessary to provide the bumps in the semiconductor element.

In forming the bumps using the solder deposited through chemical reactions, the selection of the solder composition is limited because particular chemical reactions are utilized, and it is also not easy to deal with the current movement in which lead-free (Pb-free) mounting structures are encouraged.

Further, there are a flip-chip mounting method in which an anisotropic conductive material is used in place of solder and a method in which a conductive resin material is used in place of solder. In these methods, however, there are such disadvantages that a connecting resistance is increased, it is difficult to realize the mounting with fine pitches, and it is difficult to mount the semiconductor element together with the chip components and the like in one lot.

Further, the 0603 size, for example, is practically adopted as sizes of the passive components such as the chip resistor and the chip capacitor, and the development is under way to further narrow the sizes to the 0402 size. It is very difficult to mount the passive components having such a small size according to the conventional mounting methods.

The present invention was made in order to solve the foregoing problems, and a main object of the present invention is to provide an electronic component mounting method capable of mounting passive components having a micro size such as a chip resistor and an electronic component such as a fine-pitch semiconductor element in one lot on a wiring substrate in a reliable manner and an electronic circuit device in which the method is adopted.

Means for Solving the Problems

In order to achieve the foregoing object, an electronic component mounting method according to the present invention comprises:

a first step for preparing a wiring substrate comprising a main surface and provided with conductive wirings and connecting terminals on the main surface, a group of electronic components consisting of a plurality of electronic components including at least a passive component, the respective electronic components comprising electrode terminals, and a resin composition including solder powder, convective additive and resin having fluidity at the melting temperature of the solder powder;

a second step for applying the resin composition to the main surface of the wiring substrate;

a third step for aligning positions of the connecting terminals and the electrode terminals and making the group of electronic components abut the surface of the resin composition;

a fourth step for melting the solder powder by heating at least the resin composition, making the solder powder grown while making the solder powder self-assembled between the connecting terminals and the electrode terminals using the convective additive, and solder-connecting the connecting terminals and the electrode terminals to each other; and a fifth step for hardening the resin in the resin composition and fixedly adhering each of the group of electronic components to the wiring substrate using the hardened resin.

In the foregoing method, the group of electronic components including at least a semiconductor element is preferably prepared in the first step. The passive component refers to an electronic component such as a chip resistor or a chip capacitor. The semiconductor element refers to an electronic component functioning on its own such as a semiconductor integrated circuit element. These components are the same as generally defined.

According to the method, the plurality of electronic components including at least a passive component can be solder-connected in one lot. Because it is unnecessary to previously form bumps, soldering paste and the like in these electronic components, a producing process can be largely simplified.

In the case where at least a semiconductor element is included as the electronic component, whether it is a fine-pitch semiconductor element or a bare-chip semiconductor element, the components can be mounted in one lot in the same process.

As described, according to the mounting method of the present invention, the plurality of electronic components whose types are different to one another can be mounted on the wiring substrate in the same process and under the same conditions. Further, the electronic components and the wiring substrate can be secured to each other by the resin in the resin composition subsequent to the solder-connecting step, which simplifies the process and improves reliability in the connection. Further, the present mounting method is different to the conventional method in that the solder is grown through the self assembly of the solder powder. Therefore, the respective electronic components and the wiring substrate can be favorably connected to each other even when intervals therebetween are different. As a result, a yielding percentage in the mounting process can be improved.

In a preferable mode of the third step, a temporary securing substrate comprising a plurality of recessed parts for separately housing the electronic components constituting the group of electronic components is prepared, the electronic components are inserted into the respective recessed parts of the temporary securing substrate and temporarily secured thereto, and the temporary securing substrate is positioned so as to face the resin composition so that the group of electronic components are made to abut the resin composition by one operation. The fourth step is preferably performed while the state where the group of electronic components abuts the resin composition is retained.

Accordingly, the positions on the wiring substrate at which the electronic components are provided can be accurately set. In this case, a surface of the temporary securing substrate preferably has a poor wettability with respect to the solder. Further, an adhesive tape or the like may be used in order to temporarily secure the electronic components to the recessed parts of the temporary securing substrate. As a different method, a material having a rubber elasticity may be used as the temporary securing substrate so that the electronic components are secured to the recessed parts by the rubber elasticity. In the case of mounting the electronic components whose thicknesses (dimensions in height) are not so different from each other, the temporary securing substrate may have a flat-plate shape.

The temporary securing substrate is preferably fixedly adhered to the wiring substrate by the resin of the resin composition in the third step. Accordingly, the temporary securing substrate can serve as a protective member for the electronic components.

In another preferable mode of the third step, a pressing member whose surface in contact with the group of electronic components has flexibility is prepared and after the group of electronic components is made to abut the resin composition, the group of electronic components is pressed as one lot by the pressing member so as to making the group of electronic components abut the resin composition. The fourth step is preferably performed while the state where the group of electronic components abuts the resin composition is retained.

Accordingly, the state where the electronic components abut the resin composition can be retained when the resin composition is heated so that the solder is self-assembled to be grown. As a result, micro-sized chip components can be reliably solder-connected. Further, in the case where the electronic components have different thicknesses, the flexible pressing member can absorb the different thicknesses, which allows the electronic components to be connected in one lot by means of the soldering in a stable manner.

In a preferable mode of the second step, the resin composition is applied to an entire surface of the wiring substrate, or the resin composition is applied to a region on the wiring substrate corresponding to the electronic components.

The resin composition including the convective additive having such a property that generates gas at the melting temperature of the solder powder is preferably prepared in the first step. The solder powder is preferably self-assembled on surfaces of the electrode terminals and surfaces of the connecting terminals by convection current of the gas generated from the convective additive when the solder powder is melted in the fourth step.

In the foregoing case, the resin composition including the convective additive having a boiling point which is at least the melting temperature of the solder powder and at most a hardening temperature of the resin is preferably prepared in the first step. A heating temperature of the resin composition is at least the boiling point of the convective additive and at most the hardening temperature of the resin composition in the fourth step.

The resin composition including one or two or more different convective additives selected from a group consisting of flux, glycerin and wax is preferably prepared in the first step.

Intervals between the group of electronic components and the wiring substrate are preferably retained during a period from the third step through the fifth step.

Accordingly, the convection current is surely generated by the convective additive. Therefore, the solder growth which is generated by the self assembly of the solder powder can evenly occur between the respective electrode terminals and the connecting terminals. As a result, the failure of the solder connection can be significantly avoided.

The resin composition including thermosetting resin as the resin is preferably prepared in the first step.

In the foregoing case, the resin is preferably heated and hardened in the fifth step at a temperature higher than the heating temperature of the resin composition used in the fourth step.

Accordingly, the solder connection can be surely realized by the growth of the solder, and any residual of the solder powder in the resin composition can be reduced. Further, the solder cannot be circular because the resin can be hardened in the state where the solder is melted. Therefore, the adjacent electronic components can be prevented from being short-circuited when the intervals between the terminals are fine-pitched.

The resin composition including photosetting resin as the resin is preferably prepared in the first step. In this case, the resin is preferably hardened by irradiation of light in the fifth step. Accordingly, a period of time necessary for the hardening can be reduced.

An electronic circuit device according to the present invention comprises:

a wiring substrate comprising a main surface and provided with conductive wirings and connecting terminals on the main surface;

a group of electronic components consisting of a plurality of electronic components including at least a passive component and mounted on the wiring substrate, the respective electronic components comprising electrode terminals; and a resin composition for fixedly adhering the respective electronic components to the wiring substrate, wherein the resin composition includes solder powder, convective additive and resin having fluidity at the melting temperature of the solder powder, the electrode terminals and the connecting terminals are connected to each other through the self-assembly and melt of the solder powder, and the electronic components and the wiring substrate are fixedly connected to each other by the resin.

According to the foregoing constitution, the plurality of electronic components including the passive component can be mounted in one lot and secured with the same resin. Further, in the case where one or more semiconductor elements are included, the electronic components can be mounted in one lot on the wiring substrate in a similar manner, which largely simplifies the mounting process.

An electronic circuit device according to the present invention comprises:

a wiring substrate comprising a main surface and provided with conductive wirings and connecting terminals on the main surface;

a group of electronic components consisting of a plurality of electronic components including at least a passive component and mounted on the wiring substrate, the respective electronic components comprising electrode terminals;

a protective substrate for covering the group of electronic components; and a resin composition for fixedly adhering the respective electronic components and the protective substrate to the wiring substrate, wherein the resin composition includes solder powder, convective additive and resin having fluidity at the melting temperature of the solder powder, the electrode terminals and the connecting terminals are connected to each other through the self-assembly and melt of the soldering powder, and the electronic components and the wiring substrate are fixedly connected to each other by the resin.

According to the foregoing constitution, the plurality of electronic components including the passive component can be mounted in one lot on the wiring substrate and protected by the protective substrate.

In the foregoing constitution, the electronic components preferably further include at least a semiconductor element.

Effect of the Invention

According to the electronic component mounting method according to the present invention, it becomes unnecessary to form solder bumps on either of the electronic components and the wiring substrate, which largely simplifies the mounting process. The mounting process can be further simplified because the passive component such as the chip component and the semiconductor element can be mounted in the same process. As a result, the electronic circuit device can be inexpensively provided.

DESCRIPTION OF REFERENCE SYMBOLS 1, 14, 21, 51 wiring substrate
2a, 2b, 2c, 22a,
22b, 22c, 22d, 52 connecting terminal
3 resin composition
4 resin
5 solder powder
6, 15, 16, 17, 23, 54 semiconductor element (electronic component)
7, 18, 19 chip resistor (electronic component)
8, 20 chip capacitor (electronic component)
6a, 7a, 8a, 18a, 19a, 20a
23a, 24a, 25a, 55, 58 electrode terminal
10 pressing member
11 solder
12, 30, 40, 50 temporary securing substrate
13a, 13b, 13c, 30a, 30b, 30c, 40a
40b, 40c, 50a, 50b, 50c recessed part
24 first chip capacitor
25 second chip capacitor
26 conductive wiring
40d, 40e, 40f, 40g region
50d, 50e protruding part
53 solder layer
56 solder bump
57 chip component

DETAILED DESCRIPTION OF THE INVENTION

Hereinafter, preferred embodiments of the present invention are described referring to the drawings. The like components are provided with the same reference symbols and may not be redundantly described.

First Preferred Embodiment

Figure 1A:
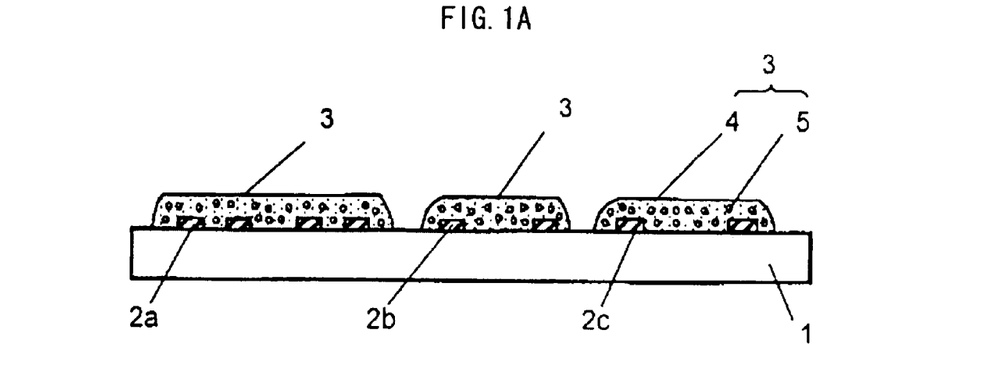
FIG. 1A is a sectional view of a first main process for describing an electronic component mounting method according to a first preferred embodiment of the present invention.
Figure 1B:
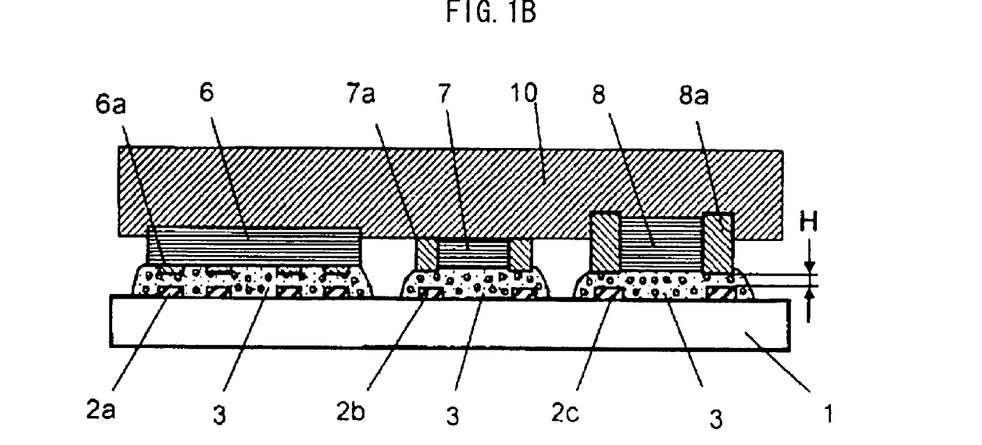
FIG. 1B is a sectional view of a second main process for describing the electronic component mounting method according to the first preferred embodiment.
Figure 1C:
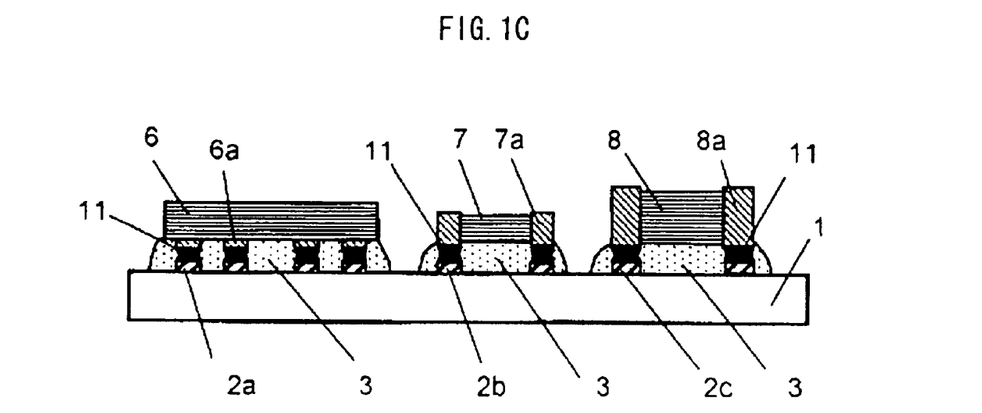
FIG. 1C is a sectional view of a third main process for describing the electronic component mounting method according to the first preferred embodiment.

FIGS. 1A-1C are sectional views of main processes for describing an electronic component mounting method according to a first preferred embodiment of the present invention.

As shown in FIG. 1A, a wiring substrate 1 provided with connecting terminals 2a, 2b and 2c corresponding to electrode terminals of respective electronic components constituting a group of electronic components to be mounted is prepared. On a surface of the wiring substrate 1 are formed, not only the connecting terminals 2a, 2b and 2c, but also conductive wirings which connect to these connecting terminals and connecting terminals for external connection, and the like, which are not shown. The wiring substrate 1 may comprise a single-layer wiring or double-surface wiring, or may have a multi-layer structure wherein an inner-layer conductor and a through electrode or an inner via, and the like, are provided, and a conductive wiring is further formed on a rear surface thereof. A main medium of the wiring substrate 1 may be resin, ceramic such as aluminum, glass, or the like.

In the present preferred embodiment is described an example in which a semiconductor element, a chip resistor and a chip capacitor are mounted in one lot as a group of electronic components. When the respective electronic components are described, therefore, they are respectively referred to as a semiconductor element 6, a chip resistor 7 and a chip capacitor 8. Further, in the present preferred embodiment, only a thin film having a favorable wettability with respect to solder is formed on a surface of an electrode terminal 6a of the semiconductor element 6, and a solder bump or the like is not provided thereon.

A connecting terminal 2a of the wiring substrate 1 is formed in such a manner as corresponding to the electrode terminal 6a of the semiconductor element 6. In a similar manner, a connecting terminal 2b is formed in such a manner as corresponding to the chip resistor 7, and a connecting terminal 2c is formed in such a manner as corresponding to the chip capacitor 8.

A resin composition 3 is spread on the wiring substrate 1. The resin composition 3 used then is paste-like and has a relatively large viscosity. The resin composition 3 includes, as its main constituents, solder powder 5, convective additive (not shown) and resin 4 having fluidity at a melting temperature of the solder powder 5. Before the resin composition 3 is applied, a surface of the wiring substrate 1, in particular, surfaces of the connecting terminals 2a, 2b and 2c are desirably cleaned with an organic solvent such as acetone or alcohol or cleaning liquid.

Below is described a case where tin(Sn)-silver(Ag)-copper (Cu)-based alloy is used as the solder powder 5, resin-based flux whose active constituent is organic acid is used as the convective additive, and thermosetting resin such as epoxy resin is used as the resin in the resin composition 3.

Next, as shown in FIG. 1B, the electrode terminal 6a of the semiconductor element 6 is position-aligned with respect to the connecting terminal 2a so that the semiconductor element 6 abuts the resin composition 3. In a similar manner, the electrode terminal 7a of the chip resistor 7 is position-aligned with respect to the connecting terminal 2b so that the chip resistor 7 abuts the resin composition 3. Further, the electrode terminal 8a of the chip capacitor 8 is position-aligned with respect to the connecting terminal 2c so that the chip resistor 8 abuts the resin composition 3.

On the surfaces of the electrode terminals 6a, 7a and 8a and the connecting terminals 2a, 2b and 2c are formed metallic layers having a favorable wettability with respect to the solder, for example, gold (Au) layers. Further, a protective film having a poor wettability with respect to the solder is formed on at least a surface of the conductive wiring on the wiring substrate in the region where the resin composition 3 is applied. Examples of the protective film include an inorganic protective film such as an oxide silicon thin film and a resin protective film such as plating resist.

After all of the electronic components such as the semiconductor element 6, chip resistor 7 and chip capacitor 8 are made to abut a surface of the resin composition 3, pressure is applied thereto by a pressing member 10 having flexibility to such an extent it does not generate any interval or displacement between the electronic components and the wiring substrate 1. As the pressing member 10 having flexibility can be used, for example, a member in which heat-resistant liquid is housed between a metallic plate and a polyimide film. Accordingly, a plurality of electronic components having different thicknesses can be easily pressed by one operation. Intervals H between the electrode terminals 6a, 7a and 8a and the connecting terminals 2a, 2b and 2c may be equally set; however, may be differently set depending on pitches the electrode terminals of the respective electronic components, for example, small in the case of fine pitches and large in the case of rough pitches. The intervals H are determined by an amount of the applied resin composition. Therefore, the applied amount may be set depending on the respective electronic components.

In the described state, at least the resin composition 3 is heated to the temperature at which the solder powder 5 is melted. The resin composition 3 may be heated by a heater from the wiring-substrate-1 side or the pressing-member-10 side. As alternative methods, the whole structure may be placed in a heating furnace to be heated from an entire periphery thereof, or microwaves may be irradiated so that only the resin composition 3 and vicinity thereof are heated.

The heating temperature reduces the viscosity of the resin 4 and increases its fluidity. At the same time, the convective additive is boiled or dissolved at the temperature, and gas is thereby discharged. The discharged gas makes the solder powder intensively move around in the resin composition 3. When the solder powder 5 in such a motion contacts the surfaces of the electrode terminals 6a, 7a and 8a and the surfaces of the connecting terminals 2a, 2b and 2c, the solder powder is captured by these surfaces having the favorable wettability with respect to the solder and grown into solder 11 in the melted state.

The solder 11 is thus grown, and the electrode terminals 6a, 7a and 8a and the connecting terminals 2a, 2b and 2c are connected to each other by the solder 11 when the gas is not any longer discharged by the convective additive.

After the electrode terminals 6a, 7a and 8a and the connecting terminals 2a, 2b and 2c are connected to each other by the solder 11 and the gas is not any longer discharged by the convective additive, the resin 4 is hardened. In the case where the thermosetting resin is used as the resin 4 of the resin composition 3, the resin 4 can be hardened when heated at a temperature higher than the melting temperature of the solder powder 5. As a result of the hardening process, the semiconductor element 6, chip resistor 7, chip capacitor 8 are adhered and secured to the wiring substrate 1.

As a result, an electronic circuit device produced by means of the electronic component mounting method according to the present preferred embodiment can be obtained.

In the case where the tin-silver-copper (Sn—Ag—Cu)-based alloy solder is used as the solder powder 5 and the resin-based flux whose active constituent is organic acid is used as the convective additive as described earlier, the temperature for heating the wiring substrate 20 in order to melt the solder powder 5 is preferably set within the range of 150-220° C.

In the case where the resin 4 is hardened so that the electronic components 6, 7 and 8 and the wiring substrate 1 are adhered and secured to each other after the connection is completed (for example, in the case where epoxy resin is used as the thermosetting resin), the heating temperature is preferably set within the range of 235-260° C.

The solder powder 5 is not necessarily limited to the Sn—Ag—Cu alloy, and any metal having a low melting point within the range of 100-300° C. can be adopted. For example, tin-zinc (Sn—Zn)-based alloy solder, tin-bismuth (Sn—Bi)-based alloy solder, copper-silver (Cu—Ag)-based alloy solder, and the like can be used as the low-melting metal.

The convective additive is not necessarily limited to the resin-based flux whose active constituent is organic acid. Any material which discharges gas when boiled or dissolved at the temperature at which the solder powder 5 is melted while the wiring substrate 1 is being heated can be adopted.

In the case where the wiring substrate 1 is a transparent substrate such as glass, photosetting resin such as photopolymerizing oligomer may be used as the resin 4 of the resin composition 3 so that the resin 4 is hardened by light thereby irradiated.

In the present preferred embodiment, the mounting method in the electronic circuit device provided with the electronic components comprising the semiconductor element, chip resistor and chip capacitor was described, however, the present invention is not limited thereto. For example, the present invention is applicable in the case where a plurality of electronic components including at least a passive component such as the chip resistor or the chip capacitor are mounted in one lot. Further, the electronic components including at least one semiconductor element may be mounted in one lot. The passive component is not limited to the chip resistor and the chip capacitor, and a passive component of the surface mounting type can be used without any limitation. The semiconductor element may be a packaged semiconductor element, or a bare-chip semiconductor element as far as it is leadless.

Second Preferred Embodiment

Figure 2A:
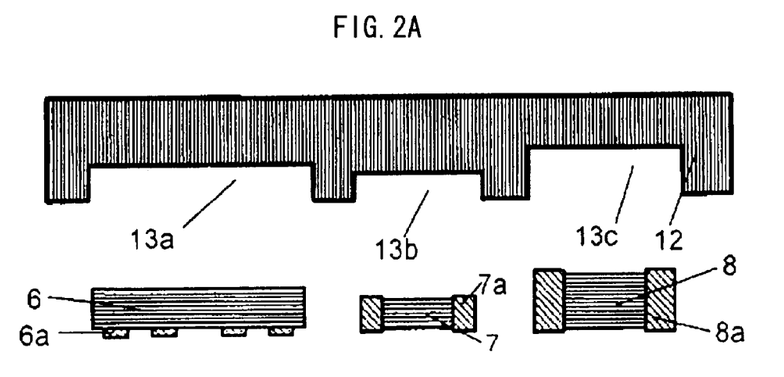
FIG. 2A is a sectional view of a first main process for describing an electronic component mounting method according to a second preferred embodiment of the present invention.
Figure 2B:
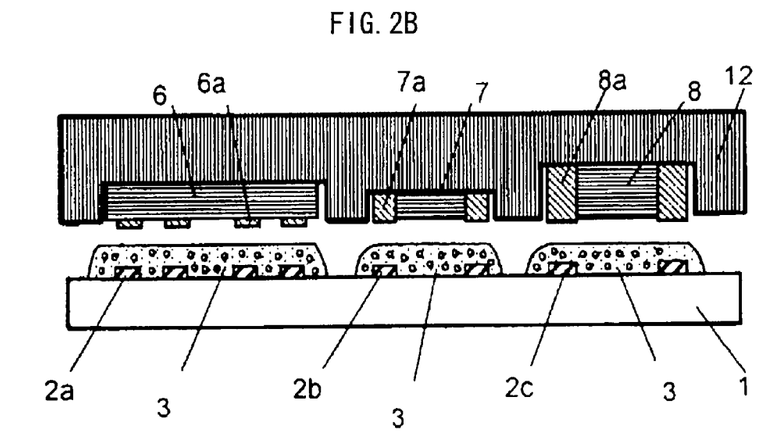
FIG. 2B is a sectional view of a second main process for describing the electronic component mounting method according to the second preferred embodiment.
Figure 2C:
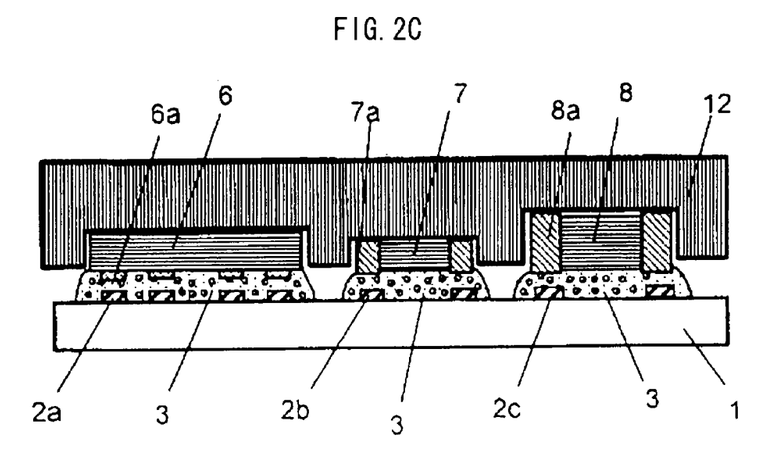
FIG. 2C is a sectional view of a third main process for describing the electronic component mounting method according to the second preferred embodiment.

FIGS. 2A-2C are sectional views of main processes for describing an electronic component mounting method according to a second preferred embodiment of the present invention. In the present preferred embodiment is described again the example in which the semiconductor element 6, the chip resistor 7 and the chip capacitor 8 are mounted in one lot as a group of electronic components. When the respective electronic components are described, therefore, they are respectively referred to as the semiconductor element 6, the chip resistor 7 and the chip capacitor 8, and may be referred to as electronic components 6, 7 and 8 when collectively described.

As shown in FIG. 2A, a temporary securing substrate 12 for retaining a plurality of electronic components 6, 7 and 8 and the group of electronic components (electronic components 6, 7 and 8) constituting an electronic circuit device are prepared. On the temporary securing substrate 12 are formed a recessed part 13a having an opening and a depth corresponding to the semiconductor element 6, a recessed part 13b having an opening and a depth corresponding to the chip resistor 7, and a recessed part 13c having an opening and a depth corresponding to the chip capacitor 8. The semiconductor element 6, the chip resistor 7 and the chip capacitor 8 are temporarily adhered to the recessed parts 13a, 13b and 13c of the temporary securing substrate 12 in such a manner as adsorption.

In the foregoing state, the temporary securing substrate 12 is position-aligned with respect to the wiring substrate 1 so that the electronic components 6, 7 and 8 abut the resin composition 3 on the wiring substrate 1 as shown in FIG. 2B.

Next, as shown in FIG. 2C, the resin composition 3 is heated in a manner similar to the first preferred embodiment, and the convective additive is thereby boiled or dissolved so that gas and convection by the gas are generated. Along with the gas convection, the solder powder 5 which is heated and melted is self-assembled on the surfaces of the electrode terminals 6a, 7a and 8a and the connecting terminals 2a, 2b and 2c so as to be grown. As the melted solder powder 5 (that is the solder 11) is grown, the electrode terminals 6a, 7a and 8a and the connecting terminals 2a, 2b and 2c are adhered to each other via the melted solder 11. When the solder 11 is further grown and the gas is not any longer discharged by the convective additive, the electrode terminals 6a, 7a and 8a and the connecting terminals 2a, 2b and 2c are connected to each other by the solder 11. After these terminals are completely connected to each other, they are heated at a temperature higher than the melting temperature of the solder powder 5 so that the resin 4 in the resin composition 3 is thermally hardened. After that, the temporary securing substrate 12 is removed. As a result, an electronic circuit device shown in FIG. 1C (having the same shape as that of the electronic circuit device according to the first preferred embodiment) is obtained.

The temporary securing substrate 12 may fixedly adsorb the electronic components 6, 7 and 8 by means of vacuum adsorption. A transparent substrate may be used as the temporary securing substrate 12, wherein an adhesive which loses its adhesive strength when light is irradiated thereon is applied to the recessed parts 13a, 13b and 13c so that the electronic components are temporarily secured by the adhesive. In this case, when the light is irradiated from a surface opposite to the surface on which the recessed parts 13a, 13b and 13c are formed when the temporary securing substrate 12 is finally removed, the adhesive strength of the adhesive is lost. As a result, the temporary securing substrate 12 can be easily removed.

The present preferred embodiment described the example in which the resin composition 3 is separately applied to each of the electronic components 6, 7 and 8 in a manner similar to the first preferred embodiment. The mounting method can be applied to an electronic circuit device shown in FIG. 3.

Figure 3:
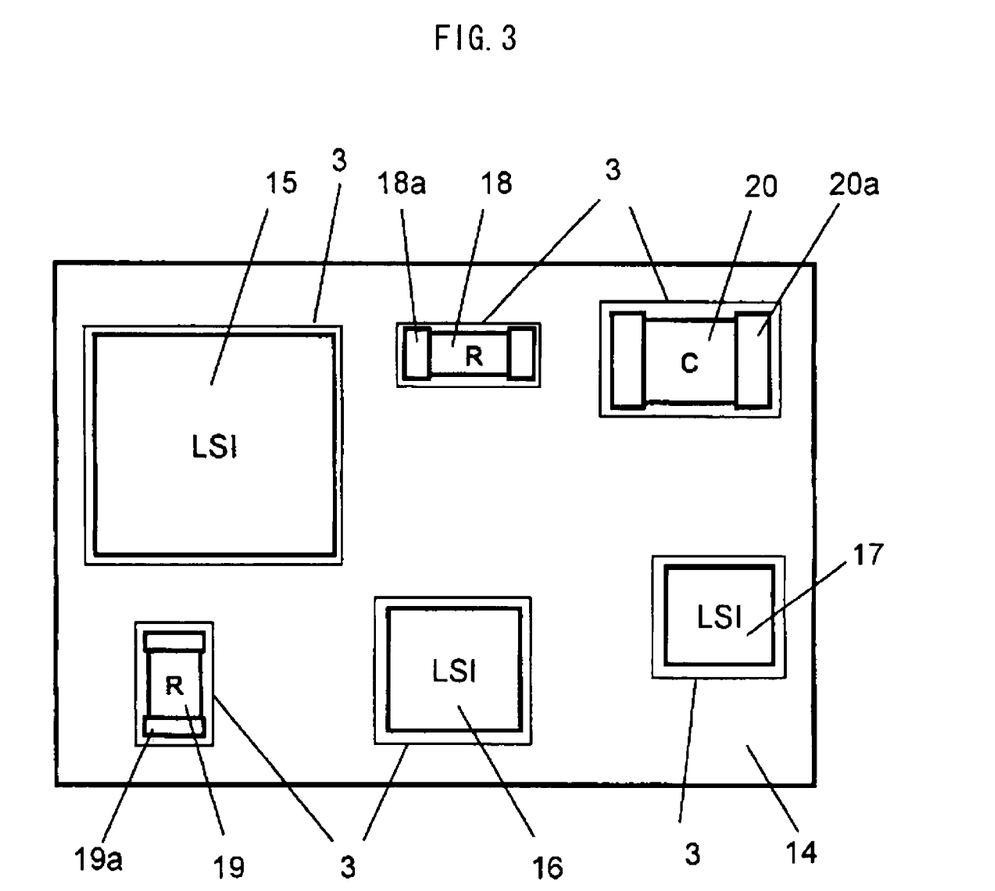
FIG. 3 is a plan view for describing another electronic circuit device whose components are mounted according to the electronic component mounting method according to the first preferred embodiment or the second preferred embodiment.

FIG. 3 is a plan view for describing another electronic circuit device whose components are amounted according to the electronic component mounting method according to the first preferred embodiment or the second preferred embodiment. In FIG. 3 is shown an electronic circuit device in which semiconductor elements 15, 16 and 17, chip resistors 18 and 19, and a chip capacitor 20 are mounted in one lot on a wiring substrate 14 as electronic components. Thus, in the case where the plurality of electronic components comprising the semiconductor elements 15, 16 and 17 and chip resistors 18 and 19 and chip capacitor 20 which are passive components are mounted in one lot, they can be mounted with a good yielding percentage and in a simplified construction method according to the mounting method of the present invention. In the case where there are relatively large intervals among the semiconductor elements 15, 16 and 17, chip resistors 18 and 19, and chip capacitor 20 as shown in FIG. 3, the resin composition 3 may be independently formed in each of the regions where the respective electronic components are mounted as described in the first and second preferred embodiments. In that case, the resin composition 3 is formed in a form (thickness, in particular) corresponding to each of the electronic components.

In FIG. 3, the chip resistors 18 and 19 and the chip capacitor 20 are respectively provided with electrode terminals 18a, 19a and 20a. The semiconductor elements 15, 16 and 17 are also provided with electrode terminals; however, the electrode terminals, which are invisible in the plan view, are not shown.

Third Preferred Embodiment

Figure 4A:
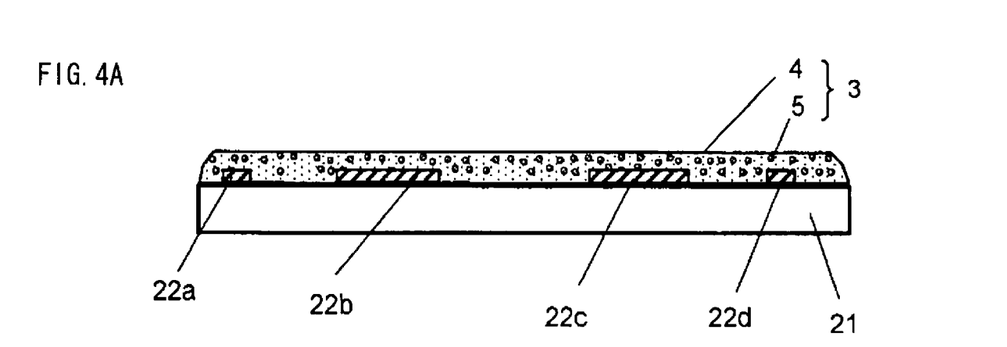
FIG. 4A is a sectional view of a first main process for describing an electronic component mounting method according to a third preferred embodiment of the present invention.
Figure 4B:
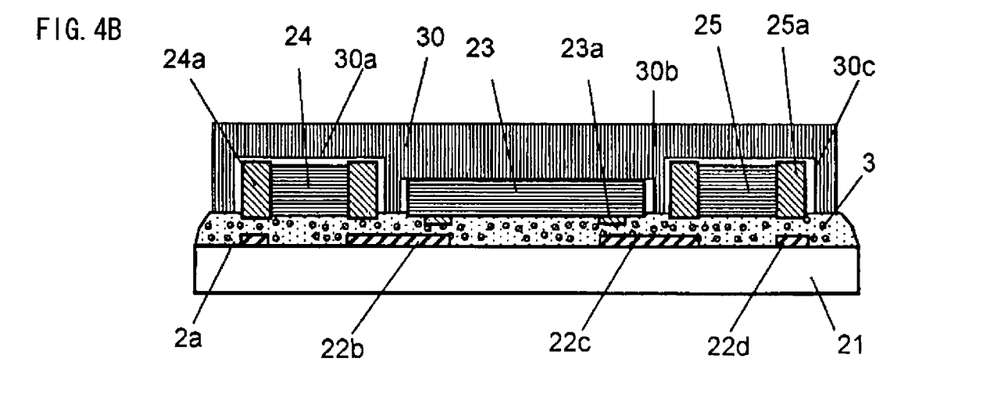
FIG. 4B is a sectional view of a second main process for describing the electronic component mounting method according to the third preferred embodiment.
Figure 4C:
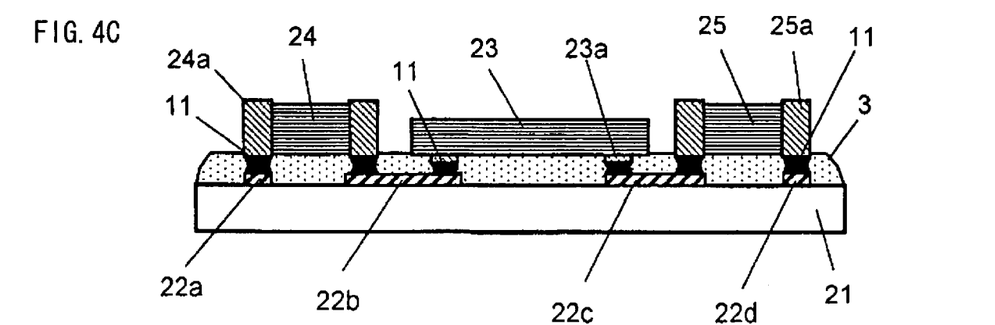
FIG. 4C is a sectional view of a third main process for describing the electronic component mounting method according to the third preferred embodiment.

FIGS. 4A-4C are sectional views of main processes for describing an electronic component mounting method according to a third preferred embodiment of the present invention. An electronic circuit device may demand the placement of a chip capacitor having a large capacity in the vicinity of electrode terminals of a semiconductor element as an electronic component in order to induce noise from power-supply wiring and prevent signal delay. In that case, the resin composition may be applied at a time to the region where the group of electronic components is provided. In the present preferred embodiment, the mounting method in such a case is described.

Figure 5:
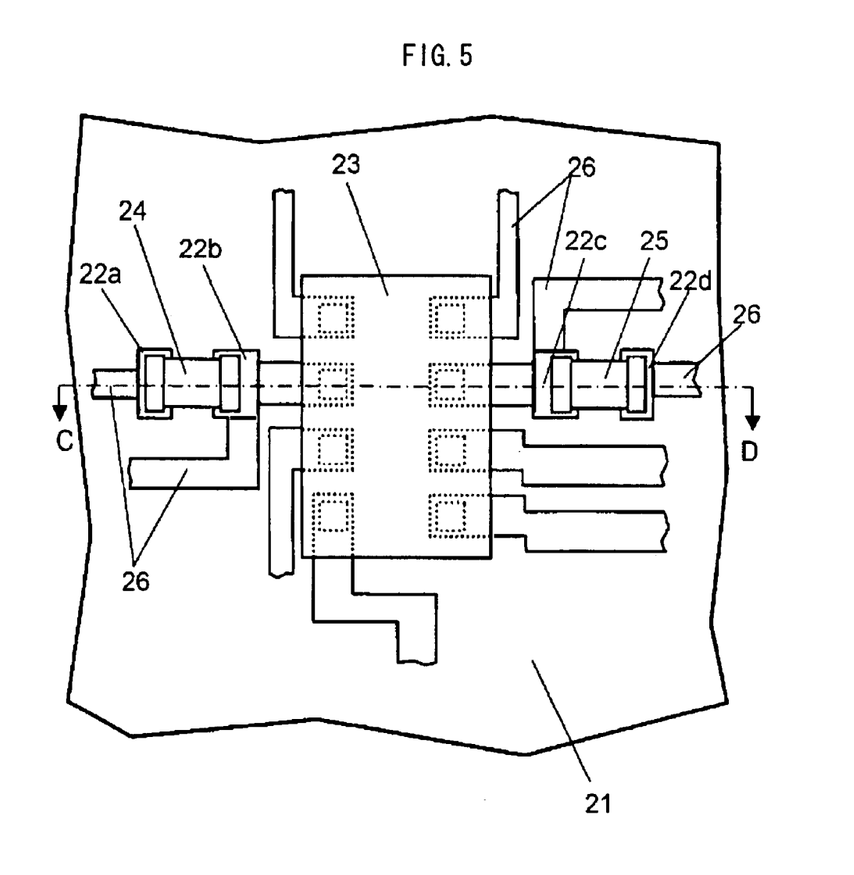
FIG. 5 is a plan view of an electronic circuit device produced according to the mounting method.
Figure 6:
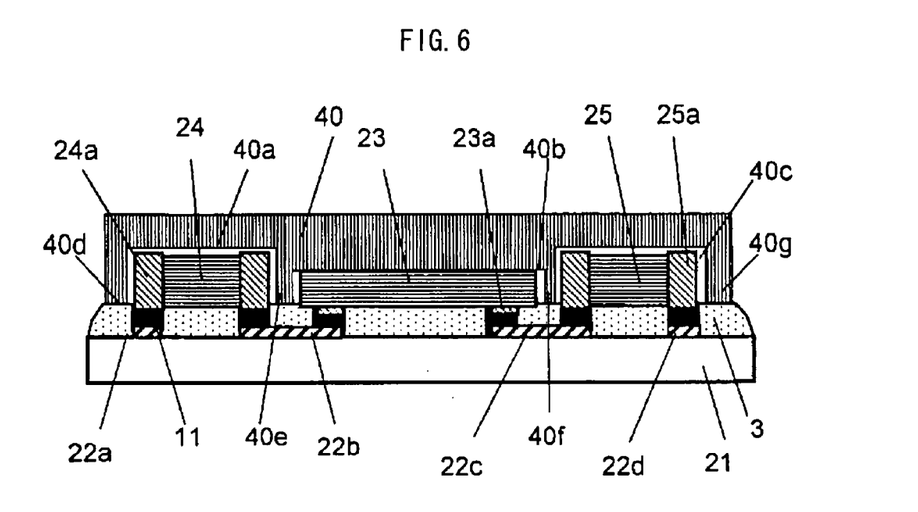
FIG. 6 is a sectional view of an electronic circuit device as a modification example produced according to the electronic component mounting method of the third preferred embodiment.
Figure 7:
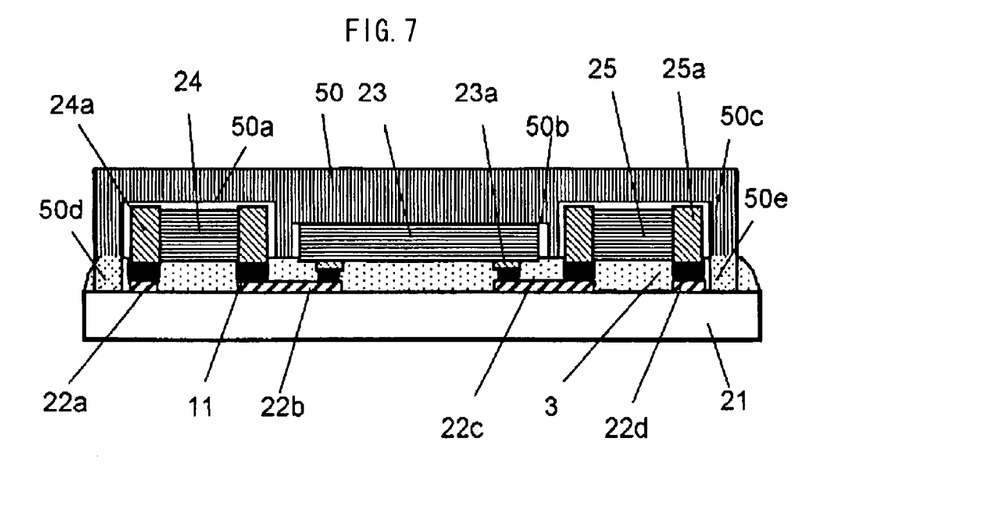
FIG. 7 is a sectional view of an electronic circuit device as another modification example produced according to the electronic component mounting method of the third preferred embodiment.

FIG. 5 is a plan view of an electronic circuit device produced according to the mounting method shown in FIGS. 4A-4C. In FIG. 5 is shown an example of a electronic circuit device provided with a group of electronic components (a semiconductor element 23, a first chip capacitor 24 and a second chip capacitor 25) on a wiring substrate 21. In many electronic circuit devices practically used, a large number of chip capacitors 25 are mounted. In the present preferred embodiment, the present invention is described referring to the structure where the first and second chip capacitors 24 and 25 are provided as a typical example. FIG. 5 also shows a part of conductive wirings 26. Further, FIG. 4C is a sectional view of the electronic circuit device shown in FIG. 5 cut along C-D line.

In FIG. 5, the first chip capacitor 24 and the second chip capacitor 25 are bypath capacitors. A power-supply line of the semiconductor element 23 is connected to the ground by the conductive wiring 26 extended from a connecting terminal 22a and the conductive wiring 26 extended from a connecting terminal 22d via the first and second chip capacitors 24 and 25, respectively.

Below is described the electronic component mounting method used to produce the electronic circuit device referring to FIGS. 4A-4C.

First, as shown in FIG. 4A, a wiring substrate 21 on which connecting terminals 22a, 22b, 22c and 22d are formed is prepared. On the wiring substrate 21 are also formed conductive wirings, which are omitted and not shown. Of the connecting terminals formed on the wiring substrate 21, the connecting terminal 22a is connected to an electrode terminal 24a of the first chip capacitor 24, the connecting terminal 22d is connected to an electrode terminal 25a of the second chip capacitor 25, the connecting terminal 22b is connected to an electrode terminal 23a of the semiconductor element 23 and the electrode terminal 24a of the first chip capacitor 24, and the connecting terminal 22c is connected to the electrode terminal 23a of the semiconductor element 23 and the electrode terminal 24a of the second chip capacitor 25. These connecting terminals 22b and 22c are connected by the conductive wiring 26. A protective film having a poor wettability with respect to the solder is formed on a surface of the conductive wiring 26, however, a thin film having a favorable wettability with respect to the solder is selectively formed on sections on the surface of the conductive wiring 26 which abut the connecting terminals 22b and 22c.

The resin composition 3 is applied to an entire surface of the wiring substrate 1 thus constituted in terms of the terminals and wirings as shown in FIG. 4A. The same resin composition as described in the first and second preferred embodiments is used as the resin composition 3.

The semiconductor element 23, the first capacitor 24 and the second capacitor 25 are embedded in recessed parts 30a, 30b and 30c of a temporary securing substrate 30, respectively and temporarily secured thereto. The structure of the temporary securing substrate 30 and the temporary fixing of the electronic components using the temporary securing substrate 30 are the same as the structure of the temporary securing substrate 12 and the temporary fixing of the electronic components using the temporary securing substrate 12 described in the second preferred embodiment.

Next, as shown in FIG. 4B, the temporary securing substrate 30 is placed to face the wiring substrate 21, and positioned-aligned thereto so that the electrode terminals 23a, 24a and 25a of the semiconductor element 23, the first and second capacitors 24 and 25 face the connecting terminals 22a, 22b, 22c and 22d, respectively. After the position-aligning, the temporary securing substrate 30 is pressed so that the semiconductor element 23 and the first and second capacitors 24 and 25 abut the resin composition 3.

In the foregoing state, at least the resin composition 3 is heated to the temperature at which the solder powder 5 is melted. The resin composition 3 may be heated by a heater from the wiring-substrate-21 side or from the temporary-securing-substrate-30 side. As alternative methods, the whole structure may be placed in the heating furnace to be heated from an entire periphery thereof, or microwaves may be irradiated so that only the resin composition 3 and vicinity thereof are heated.

At the heating temperature which melts the solder powder 5, the viscosity of the resin 4 is reduced and its fluidity is increased. At the same time, the convective additive is boiled or dissolved at the temperature, and gas is thereby discharged. The discharged gas makes the solder powder 5 intensively move around in the resin composition 3. When the solder powder 5 in such a motion contacts the surfaces of the electrode terminals 23a, 24a and 25a and the surfaces of the connecting terminals 22a, 22b, 22c and 22d, the solder powder is captured by these surfaces having a favorable wettability with respect to the solder, and the melted solder is grown on the surfaces of these terminals.

As the solder is thus grown, the electrode terminals 23a, 24a and 25a and the connecting terminals 22a, 22b, 22c and 22d are connected by the solder 11 when the gas is not any longer discharged by the convective additive.

After the electrode terminals 23a, 24a and 25a and the connecting terminals 22a, 22b, 22c and 22d are connected by the solder 11 and the gas is not any loner discharged by the convective additive, the resin 4 is hardened. When the

What is claimed is:

1. An electronic component mounting method comprising:
   a first step for preparing a wiring substrate comprising a main surface and provided with conductive wirings and connecting terminals on the main surface, a group of electronic components consisting of a plurality of electronic components including at least a passive component, the respective electronic components comprising electrode terminals, and a resin composition including solder powder, convective additive and resin having fluidity at the melting temperature of the solder powder;
   a second step for applying the resin composition to the main surface of the wiring substrate;
   a third step for aligning positions of the connecting terminals and the electrode terminals and making the group of electronic components abut the surface of the resin composition;
   a fourth step for melting the solder powder by heating at least the resin composition, making the solder powder grown while making the solder powder self-assembled between the connecting terminals and the electrode terminals using the convective additive, and solder-connecting the connecting terminals and the electrode terminals to each other; and
   a fifth step for hardening the resin in the resin composition and fixedly adhering each of the group of electronic components to the wiring substrate using the hardened resin,
   wherein the resin composition including the convective additive having such a property that generates gas at the melting temperature of the solder powder is prepared in the first step, and the solder powder is self-assembled on surfaces of the electrode terminals and surfaces of the connecting terminals by convection current of the gas generated from the convective additive when the solder powder is melted in the fourth step.

2. The electronic component mounting method as claimed in claim 1, wherein
   the group of electronic components including at least a semiconductor element is prepared in the first step.

3. An electronic component mounting method comprising:
   a first step for preparing a wiring substrate comprising a main surface and provided with conductive wirings and connecting terminals on the main surface, a group of electronic components consisting of a plurality of electronic components including at least a passive component, the respective electronic components comprising electrode terminals, and a resin composition including solder powder, convective additive and resin having fluidity at the melting temperature of the solder powder;

a second step for applying the resin composition to the main surface of the wiring substrate;

a third step for aligning positions of the connecting terminals and the electrode terminals and making the group of electronic components abut the surface of the resin composition, a fourth step for melting the solder powder by heating at least the resin composition, making the solder powder grown while making the solder powder self-assembled between the connecting terminals and the electrode terminals using the convective additive, and solder-connecting the connecting terminals and the electrode terminals to each other; and a fifth step for hardening the resin in the resin composition and fixedly adhering each of the group of electronic components to the wiring substrate using the hardened resin, wherein a temporary securing substrate comprising a plurality of recessed parts for separately housing the electronic components constituting the group of electronic components is prepared, the electronic components are inserted into the respective recessed parts of the temporary securing substrate and temporarily secured thereto, and the temporary securing substrate is positioned so as to face the resin composition so that the group of electronic components abut the resin composition by one operation in the third step, and the fourth step is performed while the state where the group of electronic components abuts the resin composition is retained.

4. The electronic component mounting method as claimed in claim 3, wherein the temporary securing substrate is fixedly adhered to the wiring substrate by the resin of the resin composition in the third step.

5. The electronic component mounting method as claimed in claim 1, wherein a pressing member whose surface in contact with the group of electronic components has flexibility is prepared and after the group of electronic components is made to abut the resin composition, the group of electronic components is pressed in one lot by the pressing member so as to making the group of electronic composition abut the resin composition in the third step, and the fourth step is performed while the state where the group of electronic components abuts the resin composition is retained.

6. The electronic component mounting method as claimed in claim 1, wherein the resin composition is applied to an entire surface of the wiring substrate in the second step.

7. The electronic component mounting method as claimed in claim 1, wherein the resin composition is applied only to a region on the wiring substrate corresponding to the electronic components.

8. The electronic component mounting method as claimed in claim 1, wherein the resin composition including the convective additive having a boiling point which is at least the melting temperature of the solder powder and at most a hardening temperature of the resin is prepared in the first step, and a heating temperature of the resin composition is at least the boiling point of the convective additive and at most the hardening temperature of the resin composition.

9. The electronic component mounting method as claimed in claim 8, wherein the resin composition including one or two or more different convective additives selected from a group consisting of flux, glycerin and wax is prepared in the first step.

10. The electronic component mounting method as claimed in claim 1, wherein intervals between the group of electronic components and the wiring substrate are retained during a period from the third step through the fifth step.

11. The electronic component mounting method as claimed in claim 1, wherein the resin composition including thermosetting resin as the resin is prepared in the first step.

12. The electronic component mounting method as claimed in claim 11, wherein the resin is heated and hardened in the fifth step at a temperature higher than the heating temperature of the resin composition used in the fourth step.

13. The electronic component mounting method as claimed in claim 1, wherein the resin composition including photosetting resin as the resin is prepared in the first step, and the resin is hardened by irradiation of light in the fifth step.

* * * * *